(12) United States Patent  
Van Der Wel et al.

(10) Patent No.: US 9,146,017 B2  
(45) Date of Patent: Sep. 29, 2015

(54) LIGHTING DEVICE

(75) Inventors: Pieter Joseph Clara Van Der Wel, Heerlen (NL); Antonius Petrus Marinus Dingemans, Tilburg (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 11 days.

(21) Appl. No.: 13/641,140

(22) PCT Filed: Apr. 14, 2011

(86) PCT No.: PCT/IB2011/051620  
§ 371 (c)(1),  
(2), (4) Date: Oct. 15, 2012

(87) PCT Pub. No.: WO2011/132120  
PCT Pub. Date: Oct. 27, 2011

(65) Prior Publication Data  
US 2013/0033888 A1 Feb. 7, 2013

(30) Foreign Application Priority Data  
Apr. 23, 2010 (EP) .................................... 10160813

(51) Int. Cl.  
*F21L 4/04* (2006.01)  
*F21V 7/18* (2006.01)  
*F21V 1/06* (2006.01)  
*H05K 1/02* (2006.01)  
(Continued)

(52) U.S. Cl.  
CPC ... *F21V 7/18* (2013.01); *F21V 1/06* (2013.01); *F21V 3/0409* (2013.01); *H05K 1/028* (2013.01); *F21K 9/56* (2013.01); *F21K 9/90* (2013.01); *F21S 4/003* (2013.01); *F21V 7/005* (2013.01); *F21V 9/16* (2013.01); *F21V 31/04* (2013.01); *F21Y 2101/02* (2013.01); *F21Y 2103/003* (2013.01); *H05K 2201/0108* (2013.01); *H05K 2201/051* (2013.01); *H05K 2201/10106* (2013.01); *H05K 2201/2054* (2013.01); *Y10T 29/49826* (2015.01)

(58) Field of Classification Search  
CPC ...... G02B 5/02; G02B 6/0096; G02B 6/0018; G02B 6/0021; F21V 21/32  
USPC ............ 362/235, 296.05, 269.01, 84, 249.07, 362/191, 198, 249.02, 800, 558, 612, 362/217.05  
See application file for complete search history.

(56) References Cited

U.S. PATENT DOCUMENTS

| 4,212,052 | A | 7/1980 | Chambard |
| 6,229,137 | B1 * | 5/2001 | Bohn ............................ 250/234 |
| 6,330,111 | B1 * | 12/2001 | Myers ........................... 359/599 |
| 6,936,968 | B2 | 8/2005 | Cross et al. |
| 7,114,830 | B2 | 10/2006 | Robertson et al. |
| 7,618,157 | B1 | 11/2009 | Galvez et al. |
| 2006/0028837 | A1 | 2/2006 | Mrakovich |

(Continued)

FOREIGN PATENT DOCUMENTS

CN 101603647 A 12/2009  
EP 2098777 A2 9/2009

*Primary Examiner* — Thomas A Hollweg  
*Assistant Examiner* — Kevin Quarterman  
(74) *Attorney, Agent, or Firm* — Yuliya Mathis (57) ABSTRACT

There is provided a lighting device and a method to manufacture such a lighting device. The inventive concept is based on manufacturing a lighting device on an at least partly flexible sheet assembly which is rolled into a tube, such that the light source of the lighting device is arranged within the tube. The flexible sheet assembly is arranged such that the tube provides a light mixing chamber and light exit surface for the lighting device. Thus, the tube shaped lighting device instantly delivers the necessary optical and mechanical properties for easy assembly and the functionality of a light engine.

15 Claims, 5 Drawing Sheets

(51) Int. Cl.
*F21V 3/04* (2006.01)
*F21V 31/04* (2006.01)
*F21K 99/00* (2010.01)
*F21S 4/00* (2006.01)
*F21V 7/00* (2006.01)
*F21V 9/16* (2006.01)
*F21Y 101/02* (2006.01)
*F21Y 103/00* (2006.01)

(56) References Cited

U.S. PATENT DOCUMENTS

| | | |
|---|---|---|
| 2007/0001709 A1 | 1/2007 | Shen |
| 2009/0140271 A1* | 6/2009 | Sah .................................. 257/88 |
| 2011/0044036 A1* | 2/2011 | Cui et al. ....................... 362/235 |
| 2011/0310587 A1* | 12/2011 | Edmond et al. ................. 362/84 |

* cited by examiner

LIGHTING DEVICE

FIELD OF THE INVENTION

The invention relates generally to lighting devices, and more specifically to a lighting device comprising at least one light source for providing light arranged in an elongated hollow, tubular member with a light exit surface for light provided by the light source. The invention further relates to a method for manufacturing such a lighting device.

BACKGROUND OF THE INVENTION

Recently, as lighting devices comprising light emitting diodes (LEDs) are used as replacement to traditional lighting devices such as conventional light bulbs, they also start being targeted at application of fluorescent tubes. U.S. Pat. No. 7,114,830 B2 discloses such a lighting device, which comprises an elongated, hollow, rigid tube into which a plurality of LEDs are inserted. The elongated, hollow tube provides a light mixing chamber with a light exit surface for light provided by the LEDs. The tube is rigid and typically made of a sturdy plastic or glass, which limits the flexibility of the manufacturing and installation of the LEDs and other functionalities of the lighting device into the tube. The lighting device is intended for use as direct replacement for a conventional fluorescent light tube in a conventional fluorescent lighting fixture.

SUMMARY OF THE INVENTION

It is an object of the present invention to provide an alternative and improved lighting device which can be manufactured and assembled in an inexpensive and flexible manner.

According to a first aspect of the invention, these and other objects are achieved with a lighting device comprising at least one light source for providing light, and an elongated hollow, tubular member. The light source is arranged inside the tubular member, and the tubular member comprises a light exit surface for light provided by the light source. The tubular member is formed by an at least partly flexible sheet assembly which comprises a base portion having an upper side onto which the light source is arranged, and at least one transparent or translucent portion for providing the light exit surface. The sheet assembly is adapted to be rolled into a tube such that the light source is arranged inside the tube.

Thus there is provided a tube shaped lighting device which instantly delivers the necessary optical and mechanical properties for easy assembly and the functionality of a light engine. The tube formed by the flexible sheet assembly provides a light mixing chamber for light provided by the light source. The sheet assembly can be designed to provide necessary stiffness, and a proper thermal interface, for easy assembly with e.g. an external transparent tube. The sheet assembly can be fully or partly flexible. That is, it may contain a rigid portion about which the flexible part of the sheet assembly is folded to form the tubular member. Basically all functionalities required for the lighting device may be integrated on the flexible sheet assembly. This can advantageously be done using 2d processing techniques and with an accurate thickness control. Further, since the light source is arranged within the tube shaped sheet assembly the arrangement inherently provides electrical safety as the light source is prevented from direct access by a user.

According to an embodiment of the lighting device, the lighting device further comprises a first optical layer arranged at the transparent portion. The first layer is preferably provided to the flexible sheet assembly in an un-rolled state, i.e. while the sheet assembly is substantially arranged as a flat sheet, which is advantageous. This allows for easier optical lamination, or lamination of larger surfaces which can be cut to size afterwards. This is advantageous for mass production of flexible sheet assemblies.

According to an embodiment of the lighting device, the first optical layer is one of a diffusing layer and a wavelength converting layer, which is advantageous for providing a smooth light output, or a desired wavelength of light from the lighting device. The diffusing layers and wavelength conversion layers can be integrated in one film, or added as separate films or each can be added in several layers allowing for graded light conversion or diffusivity. As mentioned above, the advantage of assembling film/sheet materials is ease of (2d) processing and also very important the thickness control. The thickness of a wavelength converting layer typically needs to be within +/−2% which is really difficult using other processes.

According to an embodiment of the lighting device, the first optical layer is applied to the transparent or translucent portion by means of lamination, deposition, or in the bulk of the transparent or translucent portion by means of extrusion or co-extrusion, which is advantageous. It is further possible to combine the wavelength converting and scattering functionality in one component.

According to an embodiment of the lighting device, the transparent or translucent portion is arranged as a separate foil which is interconnected to an edge of the base portion to form the flexible sheet assembly. This allows for different optical properties of each part According to an embodiment of the lighting device, the transparent or translucent portion is further arranged having one of a diffusive surface, a semi-transparent film, and a reflective pattern, or comprising reflective or diffuse particles. As an example, high reflective opaque particles as typically used in volume diffuser components may be integrated in the film. This allows for engineering of the luminance distribution of the exit window and for decreasing the LED source brightness.

According to an embodiment of the lighting device, the flexible sheet assembly further comprises a reflective layer arranged at the side or near the light source. This increases the performance of the light engine, i.e. the lighting device, since no external reflectors are required. Furthermore, the lighting device light distribution can be engineered to bring a higher efficiency in different applications. Also the reflective layer can comprise a heat dissipation functionality for the thermal management.

According to an embodiment of the lighting device, the base portion is reflective or integrates a reflective functionality. This allows for use of less components to form the lighting device, as compared to adding a reflective sheet on top of the transparent base According to an embodiment of the lighting device, the base portion is a fully or partly transparent or translucent foil. This is advantageous if it is required that some light is backscattered (e.g. to increase the cosmetic appearance of luminaries).

According to an embodiment of the lighting device, the lighting device further comprises an transparent hollow outer body. The sheet assembly is arranged within the outer body. In this embodiment the flexible sheet assembly offers a pre-assembly in which all required electrical, and optical functionalities can be integrated in a sheet assembly which is advantageous from a manufacturing point of view, and which then can easily be assembled with the outer body, like a glass tube, for a final assembly. Using a glass tube then provides an extra layer of electronic ensulation and mechanical protection for the lighting device. Further, when providing e.g. a glass tube replacement, the appearance of the lighting device when having a glass envelop adds to the product similarity.

According to an embodiment of the lighting device, the outer body is arranged having a reflecting portion and/or a diffusive translucent portion, which can be advantageous from a cost point of view.

According to an embodiment of the lighting device, the light source comprises at least one light emitting diode "LED" or LED die.

According to an embodiment of the lighting device, the outer body is hermetically sealed after being evacuated, filled with gas, or filled with a liquid or a solidifying material like silicones. A controlled atmosphere inside the lighting device can be beneficial to the light source, e.g. the LED, and/or the wavelength conversion layer performance and/or lifetime. This may be achieved by providing e.g. a dry atmosphere, an inert atmosphere, or a reactive atmosphere that eliminates oxygen.

According to a second aspect of the invention, there is provided a method for manufacturing a lighting device comprising providing an at least partly flexible sheet assembly by mounting at least one light source to an upper surface of a fully or partly flexible sheet, providing a transparent or translucent portion to the flexible sheet, providing an optical layer to an upper surface of the transparent or translucent portion, and then rolling the flexible sheet assembly into a tube such that the light source is arranged within the tube. The tube provides a light mixing chamber and the transparent or translucent portion provides a light exit surface from the tube for light provided by the light source.

According to an embodiment of the method, the method further comprises closing the tube, thereby providing for a closed tubular envelop providing electronic insulation to live parts. By closing the tube, a freestanding lighting device is formed. The freestanding lighting device is also suitable for being inserted into an outer body, e.g. a glass tube as described above. The flexible sheet formed into a tube which is closed before being inserted into the outer tube, provides extra electronic insulation, which is advantageous in case the outer tube breaks.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

FIG. 3a-b, are schematic cross-sectional side views of an embodiment of a lighting device according to the present invention, in which the process steps for manufacturing the lighting device are illustrated in FIG. 3a;

FIG. 5a-b, are schematic cross-sectional side views of an embodiment of a lighting device according to the present invention, in which the process steps for manufacturing the lighting device are illustrated in FIG. 5a;

DETAILED DESCRIPTION

Figure 1A:
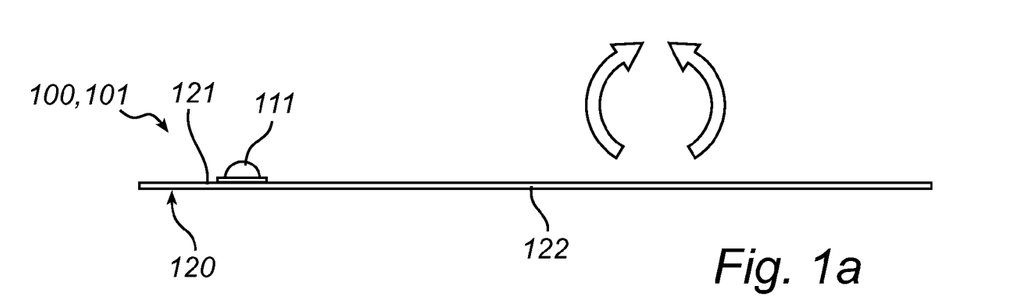
FIG. 1a-b, are schematic cross-sectional side views of an embodiment of a lighting device according to the present invention.

A lighting device 101 according to the present inventive concept is illustrated in FIG. 1a in an unrolled state. The lighting device comprises a sheet assembly 100 which is based on a carrier foil 120 which here is a transparent flexible foil. The transparent carrier foil is typically made of a suitable polymer, which is either clear or diffuse. Further, the carrier foil may be a stacked foil, comprising multiple layers. A light source 111, here comprising a linear array of light emitting diodes (LED) for light generation, is arranged on an upper side 121 of the carrier foil 120. The light source 111 is composed of a printed circuit board (PCB) with packaged LEDs. The light source 111 is attached to the carrier foil 120 by means of an adhesive, such as a silicone or a two-component thermal paste. Any suitable adhesive, which preferably has good thermal conductivity is applicable. Alternatively the light source may be attached by means of mechanical fixation such as a coiled spring. Suitable electrical connections means (not shown) for the light sources are provided at the edges of the array, either as an electrical connector on the PCB or as a solder pad. The electrical connection means are further arranged to be electrically connected to a for the individual application applicable power supply.

Figure 1B:
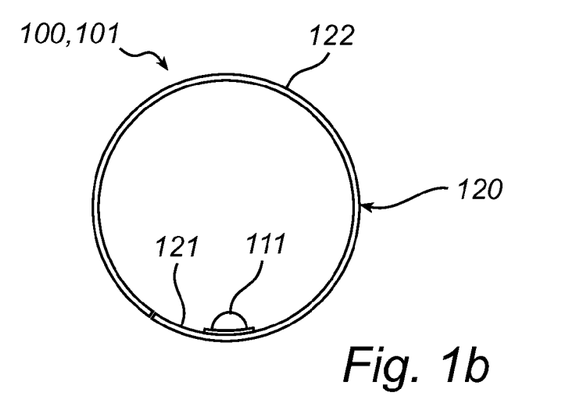

With the light source 111 in place the lighting device 100 is rolled into a tube, i.e. an elongated, hollow, tubular member, as depicted in FIG. 1b. To fixate the tube shape, the edges of the carrier foil 120 which abuts each other as the tube is formed are glued together or welded along the tube.

Alternatively the tube shape can be maintained e.g. by arranging supports such as O-rings at the end portions of the tube (not shown), or clips at the end portions of the tube (not shown). The sheet assembly can also be rolled and fixed into the final rigid shape, with both sides fixed together to form a rigid tube, before inserting it into an outer body, as will be described herein under. In this case the rigid tube can be folded and unfolded in a certain area before and after insertion respectively.

By fixating the tube shape, a freestanding lighting device 100 is formed. The stiffness of the carrier foil 120 is preferably selected such that the lighting device 101 has sufficient mechanical properties for handling and for providing protection of the electronics contained within the tube.

As explained above, the carrier foil 120 is the base of a sheet assembly which is adapted to be rolled into a tube. The requirement that the sheet assembly is possible to roll into a tube means that it is at least partly flexible such that a part of it can be rolled to allow the sheet assembly to form a hollow tube. For instance a possible solution is that a base portion, which is defined as the part of the sheet assembly onto which the light source is arranged, is rigid, while the transparent portion is flexible such that it can be rolled over the base portion. The opposite is also applicable, i.e. that base portion is flexible while the transparent portion is rigid.

The sheet assembly is here based on a simple carrier foil. However, the sheet assembly may be a stack of multiple foils. In alternative embodiments (not shown) different optical properties are provided on each side of the carrier foil. The carrier foil can for instance be partly white on the upper side 121, and partly black on the lower side. Further, the carrier foil may contain text, such as a company logo, technical data, alignment markers to facilitate further processing during manufacturing of the lighting device. The carrier foil can be reflective or even absorbing. Further, the carrier foil can be directly equipped with an electrically conductive surface or electrically conductive tracks for providing electrical energy to the light sources.

The light source 111 on the upper side 121 of the carrier foil 120 is arranged within the tube formed by the sheet assembly. The tube provides a light mixing chamber for light provided by the light source 111. A transparent portion 122 which here is a part of the transparent carrier foil 120 is arranged on an opposite side of the tube with respect to the light source 111. The transparent (or alternatively translucent) portion 120, provides a light exit surface from the tube.

Figure 2A:
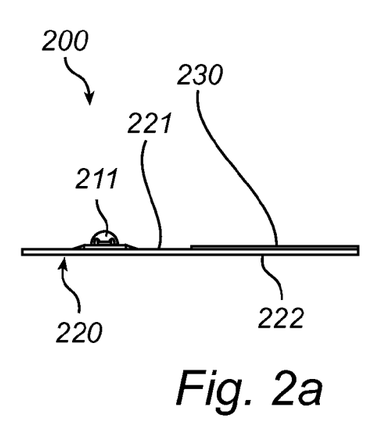
FIG. 2a-c, are schematic cross-sectional side views of an embodiment of a lighting device according to the present invention.
Figure 2B:
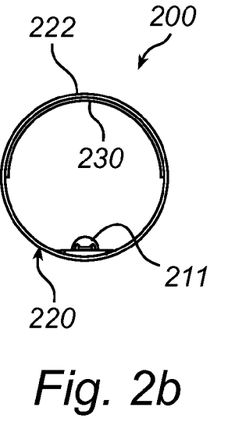
Figure 2C:
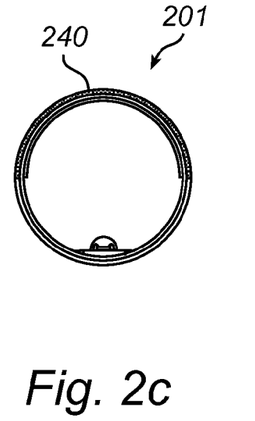

In an embodiment of the lighting device 201, see FIG. 2, the sheet assembly 200 comprises a carrier foil 220. The upper side 221 of the carrier foil 220 is arranged with electrically conductive tracks (not shown) to which tracks a light source 211 is connected. The light source 211 comprises white LEDs. Further, a transparent portion 222 arranged by the side of the base portion of the carrier foil 220, has an optical layer 230 arranged on the upper side 221. The optical layer 230 is a white diffusive film applied to the carrier foil 220 by means of lamination. The colour of the diffusive film can be selected for each individual application of the lighting device. In FIG. 2b, the sheet assembly 200 is rolled into a tube such that the light source 211 is arranged within the tube, and is arranged opposite to the transparent portion 222 with the diffusive layer 230. In this embodiment of the lighting device, the sheet assembly 200 is further inserted into a transparent hollow outer body, a glass tube 240, see FIG. 2c. The outer body can also be made in a suitable transparent polymer material. Preferably, the outer body is dimensioned so as to match the size of the tube formed by the sheet assembly 200, both in terms of the diameter of the tube and the length of the tube.

The sheet assembly 200 is arranged to expand diametrically after insertion into the outer glass tube 240 due to its own elastic force, such that a good contact with the inner wall of the glass tube 240 is achieved.

In an embodiment, the sheet assembly is glued onto the inner surface of the outer body. The glue can be chosen to increase the heat transfer from the lighting device, or be chosen having a refraction index adapted to reduce Fresnel reflection.

Alternatively, the sheet assembly is assembled with e.g. coiled springs or with solid shapes (not shown) that hold the sheet assembly in a desired shape. The solid shapes can have added functionality such as electrical contacting between the carrier foil and the lamp caps.

When inserting the rolled sheet assembly into an outer body, the fixation of the tube shape of the sheet assembly is no longer necessary. However, it may be advantageous to fixate the sheet assembly to be a freestanding unit for some different reasons. Firstly, the freestanding, closed, sheet assembly provides extra security, if the outer body breaks. The closed sheet assembly provides an insulation conduit, and any electrical wires inside the foil assembly can be considered double insulated by the outer body and the closed sheet assembly. Thus, if the outer body, e.g. an outer glass tube, breaks the closed sheet assembly still guarantees safety. The requirement for mains insulated drivers can then be less stringent. Further, the sheet assembly can be closed upon itself to simplify assembly with an outer tube or to avoid sagging of the carrier foil over the lamp lifetime.

An additional advantage of the present inventive concept, is that disassembly at the end-of-life is made easier, as the outer body can be recycled after removing the sheet assembly.

Figure 3A:
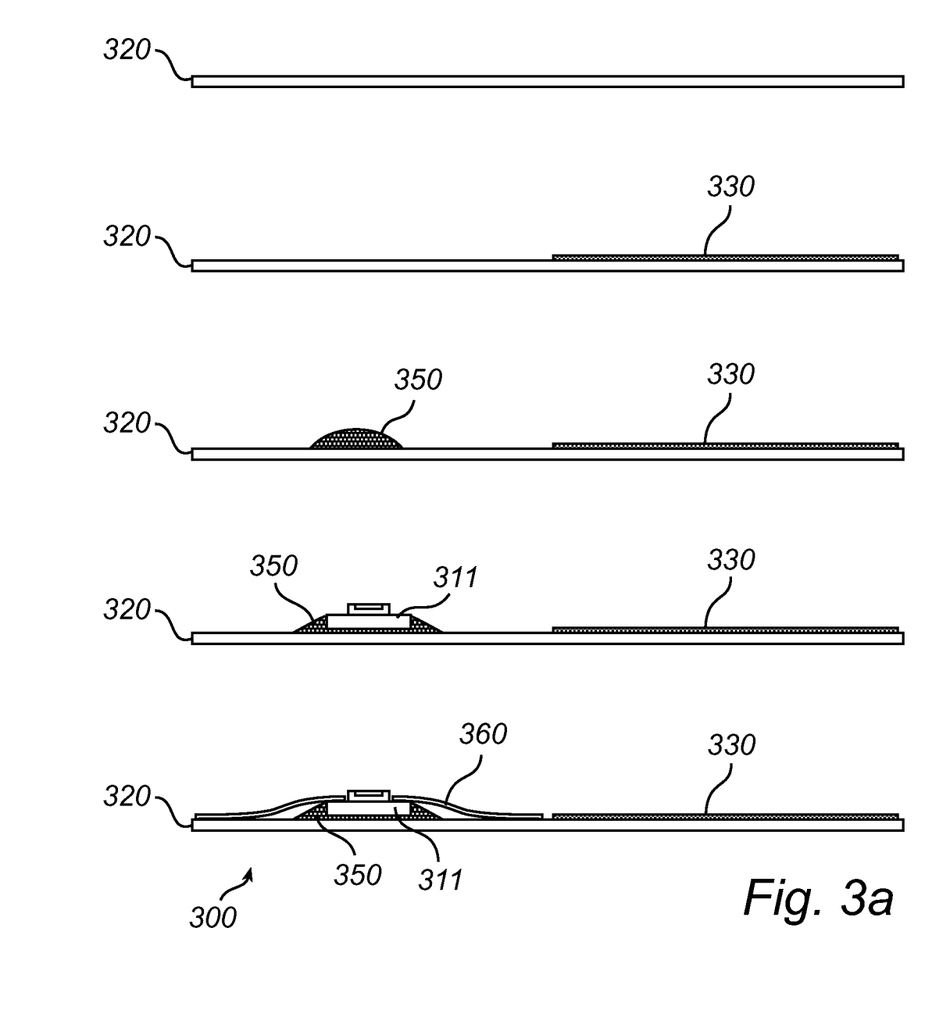
Figure 3B:
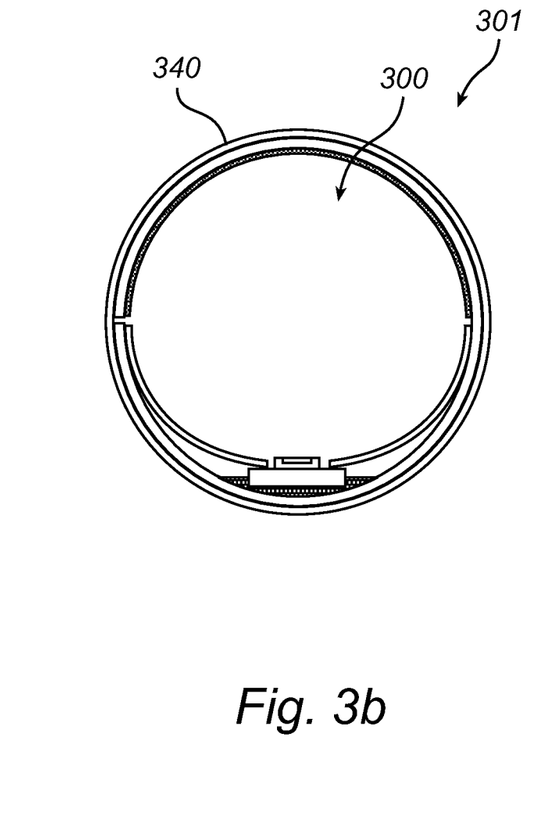

The assembling of a lighting device 301 according to the present inventive concept is described herein under with reference to FIGS. 3a and 3b. A transparent carrier foil 320 is first provided. A base portion of the carrier foil is intended for carrying the light source of the device. A phosphorous material 330 is deposited on about half the upper surface of the carrier foil 320, which part is intended to be the light output of the lighting device 301. The phosphorous material is a wavelength converting material and used in combination with LEDs to produce visible light. This is known to the man skilled in the art and will not be further discussed herein. A, preferably gap filling, adhesive 350 is applied to the base portion on the upper surface of the carrier foil 320, which adhesive is used to attach a light source 311, a blue LED on a PCB, to the carrier foil 320. The adhesive is selected to secure a good mechanical and thermal connection of the PCB to the carrier foil 320. The PCB is in this embodiment a Metal Core (MC) PCB, but any suitable type is applicable. A white high reflective mask 360 is added at the light source 311 covering substantially the base portion of the carrier foil 320. Further, the mask 360 is adapted such that only the blue LED is exposed upwards with respect to the upper surface of the carrier foil 311, i.e. the PCB and adhesive of the light source is covered. The reflective mask 360 is here a self sticking foil. The reflective mask 360 is advantageous for masking off parts of the light source that need not be exposed, for instance when the light source is a LED array arranged on a relatively wide PCB or lead frame, which is applicable for increasing the heatsink surface of the light source. Additionally, if for instance silicone glue is used to attach the light source to the carrier foil, any overdosed amount of silicone can flow under the mask where it is left to cure further.

In FIG. 3b, the sheet assembly 300 formed by the carrier foil 320, the light source 311, the phosphorous layer 330 and the reflective mask 360, has been rolled into a tube and been inserted in a glass tube 340. The edges of the carrier foil 320 which abuts each other as the tube is formed are not fixated to each other here. When the mask 360 is a self sticking foil it may in alternative embodiments be used to fixate the tube shape as well, by being dimensioned to overlap the edges of the carrier foil which abuts each other.

Figure 4A:
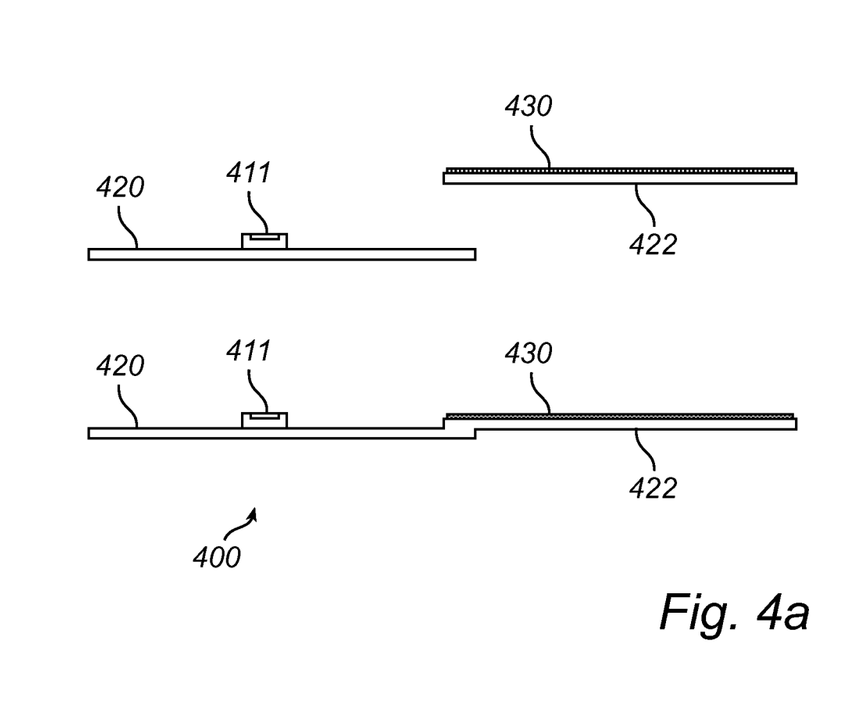
FIG. 4a-b, are schematic cross-sectional side views of an embodiment of a lighting device according to the present invention.

An embodiment of a lighting device 401 according to the present inventive concept, and an alternative way of manufacturing the lighting device, is illustrated with reference to FIGS. 4a and 4b. Here a light source 411, comprising a blue LED, is attached directly to an opaque foil 420, which integrates the optical reflector functionality, which was introduced by the white reflective mask in the foregoing example, in the carrier foil itself. The opaque foil 420 may be a metal foil, e.g. Al, and is preferably selected to provide sufficiently high light reflectivity in the blue spectrum (when utilizing a blue light source). A separate transparent carrier foil 422 is provided with a wavelength conversion foil 430 over the full surface area by means of lamination.

The separate transparent carrier foil, or the transparent portion of a common carrier foil, is in alternative embodiments provided with the phosphorus material or another or additional optical layer like a diffusive surface, a semi-transparent film, a reflective pattern etc. by means of deposition, lamination, extrusion or co-extrusion according to known techniques within the field. Thus, a number of different optical functionalities can advantageously be integrated in the sheet assembly. It is a particular advantage to provide the optical layers on a flat film because it allows deposition of wavelength conversion material like inorganic phosphors or organic phosphors or quantum dots with a high control of thickness and uniformity. The wavelength conversion layers, or other optical layers, may be deposited in a single layer, in multiple layers or in mixed layers. The combination of a wavelength conversion foil and a semi-transparent foil or a reflective pattern can be used to control the light output intensity of the lighting device, and to locally regulate the luminance from the lighting device. A semi-transparent foil can also be used without the addition of a wavelength conversion material.

The transparent carrier foil 422 and the opaque foil 420 are subsequently interconnected by means of a weld joint to form a sheet assembly. Alternatively, the interconnection is provided by means of an adhesive, a tape or other suitable means.

Figure 4B:
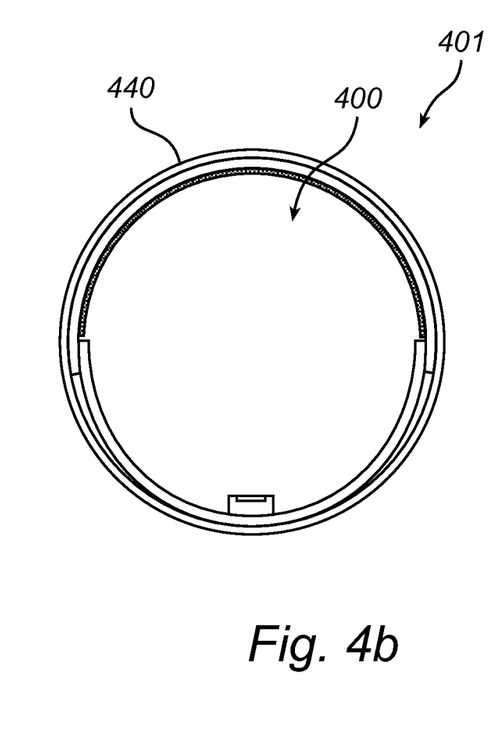

The sheet assembly 400 is formed into a tube which is inserted in an outer glass tube 440, see FIG. 4b. As depicted in FIG. 4b the tube is closed, i.e. the transparent carrier foil 422 and the opaque carrier foil 420 are interconnected by means of weld joints on either end, forming longitudinal connections, which are sufficiently strong to provide for electrical safety if the glass tube breaks.

The interconnect between separate carrier foils, can alternatively be provided by means of point welding stacked multiple stamped flexible foils.

Figure 5A:
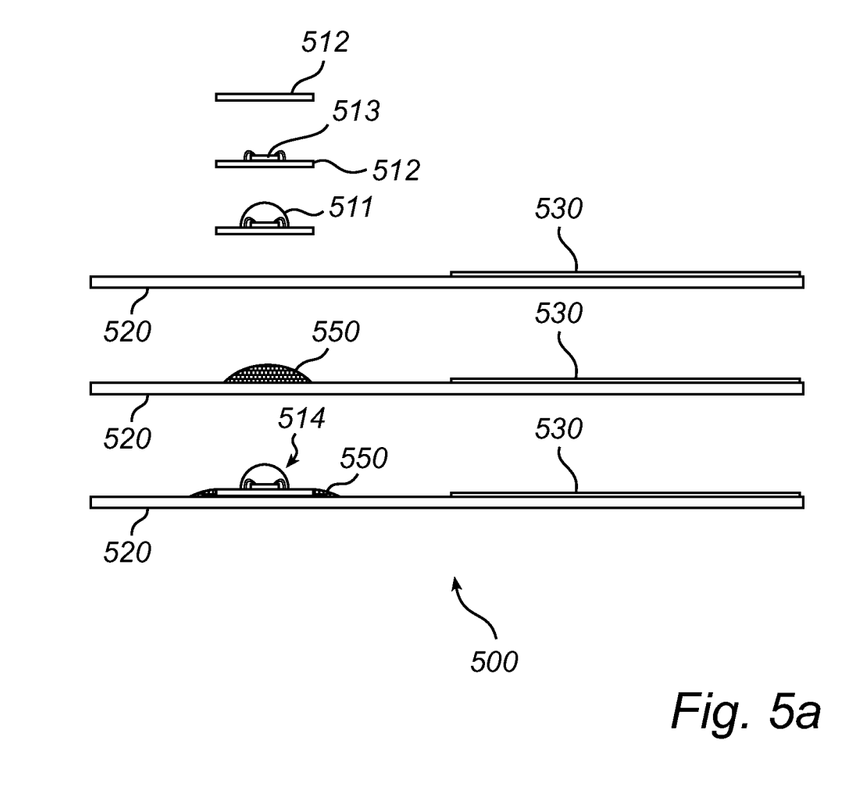
Figure 5B:
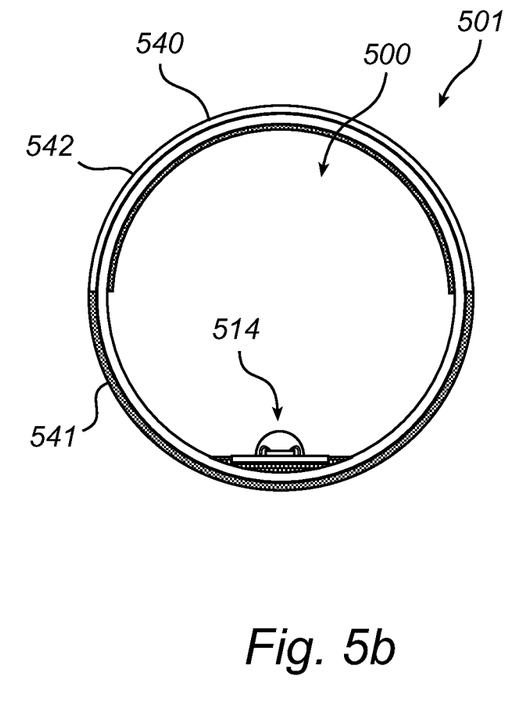

In an embodiment of the lighting device 501 as described with reference to FIGS. 5a and 5b, instead of using LEDs on an interconnect, dies 513 are arranged on a lead wire track 512 and provided with a protecting silicone dome 511. The resulting light source subassembly 514 is glued onto a transparent carrier foil 520 with an adhesive 550. The carrier foil 520 is provided with a phosphorous material 530 as previously described. The resulting sheet assembly 500 is rolled into a tube and inserted in an outer tube 540, which is a TLD Reflex tube 540, i.e. a glass tube that is arranged with a reflecting layer provided typically circumferentially half around its inner surface 541 along the tube and having a transparent surface 542 on the opposite half. The rolled tube is positioned such that the light source 514 is arranged at this reflecting surface of the outer tube 540.

The insertion of the carrier foil into an outer body can be done in different manners. An effective way to insert a carrier foil into an outer body according to the present inventive concept is to make use of a Teflon insertion sheet. The sheet assembly is placed onto the insertion sheet. The sheet assembly and the insertion sheet are subsequently made into a roll, or tube, and inserted into the outer body. The insertion sheet is then extracted again allowing the sheet assembly to settle itself inside the outer body. If the sheet assembly is closed upon itself it can be inserted without insertion sheet, e.g. by sliding or blowing it into the outer body.

In embodiments, after assembly of the sheet assembly and the outer body, the lighting device cavity is evacuated or filled with a gas and sealed. Alternatively, the lighting device cavity can be filled with a liquid or a solidifying material like silicones.

Figure 6:
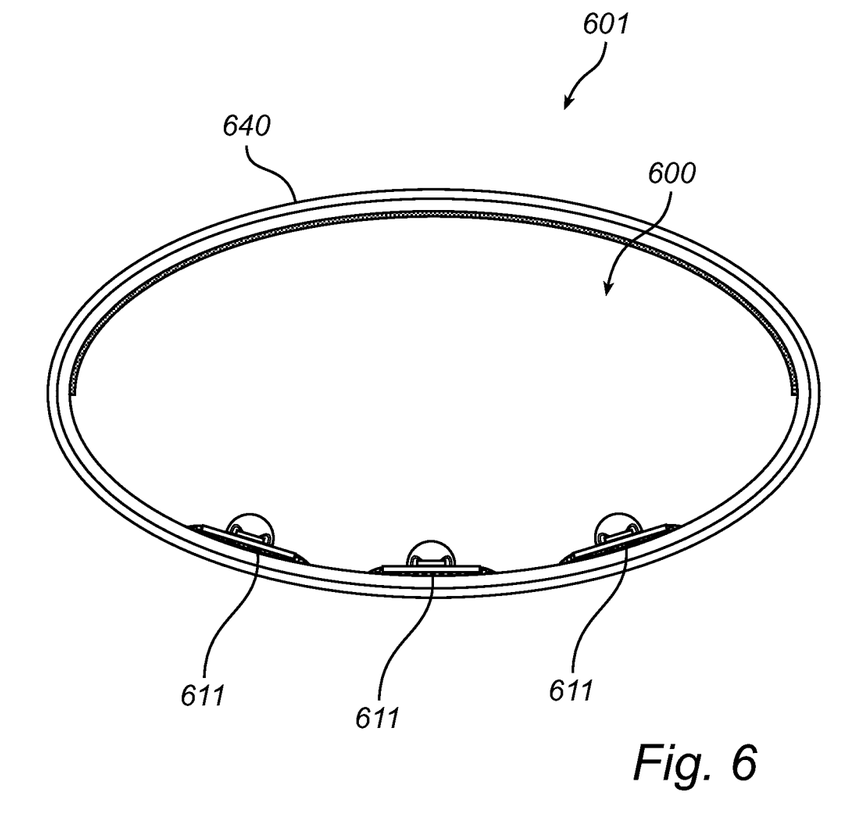
FIG. 6 is a schematic cross-sectional side view of an embodiment of a lighting device according to the present invention.

The outer body can be cylindrical but other tubular shapes are possible. In FIG. 6 an elliptic cross section of the outer body 640 is illustrated. When providing a flexible but yet resilient carrier foil, the sheet assembly 600 will adapt to the shape of the outer body 640. Further, and as is illustrated in the lighting device in FIG. 6, the LED array need not necessarily be a single line on LEDs. Multiple lines of LED arrays 611, with a significant distance in between, are shown. The elliptic cross section of the lighting device 601 is here advantageous for providing a low luminance value and reduced glare.

Alternatively, the linear array can be composed of a PCB with chip-board LEDs, or be a linear lead frame with LED-dies and wirebonds that in addition may be silicone over-moulded locally or over the full length. The LEDs or LED-dies can be combined with wavelength conversion material. The linear assembly may also be based on a foil with an electrically conductive surface. LEDs in a linear array are suitable for the present inventive concept, but other arrangements are applicable as well. The linear array is in embodiments of the invention equipped with separate lenses or a common linear lens.

Further, in alternative embodiments of the lighting device, the light sources can be combined with light sources arranged on the inside of the outer body (not shown) The construction of the light sources on the side of the transparent hollow outer body can be a part of the sheet assembly, but can alternatively be separate light sources or be integrated with outer parts such as lamp caps. Adding LEDs on the side may be done for decorative purposes or accent lighting or e.g. a night light. For these purposes the LEDs on the side can be provided with separate connections and drivers to mains.

The person skilled in the art realizes that the present invention by no means is limited to the preferred embodiments described above. On the contrary, many modifications and variations are possible within the scope of the appended claims.

The invention claimed is:

1. A lighting device comprising:
   at least one light source for providing light; and
   an elongated, hollow, tubular member,
   wherein said light source is arranged inside said tubular member, and wherein said tubular member comprises a light exit surface for light provided by said light source;
   characterized by:
   said tubular member being formed by an at least partly flexible sheet assembly comprising:
   a base portion having an upper side onto which said light source is arranged; and
   at least one transparent or translucent portion for providing said light exit surface,
   wherein said sheet assembly is adapted to be rolled into a tube such that said light source is arranged inside said tube.

2. A lighting device according to claim 1, further comprising a first optical layer arranged at said transparent portion.

3. A lighting device according to claim 2, wherein said first optical layer is one of a diffusing layer and a wavelength converting layer.

4. A lighting device according to claim 2, wherein said first optical layer is applied to said transparent or translucent portion by means of lamination, deposition, or in the bulk of the transparent or translucent portion by means of extrusion or co-extrusion.

5. A lighting device according to claim 4, wherein said transparent or translucent portion is arranged as a separate foil which is interconnected to an edge of said base portion to form said flexible sheet assembly.

6. A lighting device according to claim 4, wherein said transparent or translucent portion is further arranged having one of a diffusive surface, a semi-transparent film, and a reflective pattern, or comprising reflective or diffuse particles.

7. A lighting device according to claim 1, wherein said flexible sheet assembly further comprises a reflective layer arranged at the side or near said light source.

8. A lighting device according to claim 1, wherein said base portion is reflective or integrates a reflective functionality.

9. A lighting device according to claim 1, wherein said base portion is a fully or partly transparent or translucent foil.

10. A lighting device according to claim 1, further comprising a transparent hollow outer body, wherein said sheet assembly is arranged within said outer body.

11. A lighting device according to claim 10, wherein said outer body is arranged having a reflecting portion and/or a diffusive translucent portion.

12. A lighting device according to claim 10, wherein said light source comprises at least one light emitting diode.

13. A lighting device according to claim 10, wherein said outer body is hermetically sealed after being evacuated, filled with gas, or filled with a liquid or a solidifying material like silicones.

14. Method for manufacturing a lighting device comprising providing an at least partly flexible sheet assembly by:
- mounting at least one light source to an upper surface of a fully or partly flexible sheet;
- providing a transparent or translucent portion to said flexible sheet;
- providing an optical layer to an upper surface of said transparent or translucent portion; and
- rolling said flexible sheet assembly into a tube such that said light source is arranged within said tube, wherein said tube provides a light mixing chamber and said transparent or translucent portion provides a light exit surface from said tube for light provided by said light source.

15. Method according to claim 14, further comprising closing said tube, thereby providing for a closed tubular envelop providing electronic insulation to live parts.

\* \* \* \* \*